United States Patent
Chan

(10) Patent No.: US 6,658,315 B2
(45) Date of Patent: Dec. 2, 2003

(54) NON-SYNCHRONOUS CONTROL OF PULSED LIGHT

(75) Inventor: Kin Chan, Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/682,911

(22) Filed: Oct. 31, 2001

(65) Prior Publication Data

US 2003/0084422 A1 May 1, 2003

(51) Int. Cl.[7] .............................................. G06F 19/00
(52) U.S. Cl. ......................... 700/121; 700/121; 716/21
(58) Field of Search ........................... 700/121; 716/21; 250/491.1–492.3

(56) References Cited

U.S. PATENT DOCUMENTS

| | | | | |
|---|---|---|---|---|
| 4,615,595 A | * | 10/1986 | Hornbeck | 353/122 |
| 5,079,544 A | * | 1/1992 | DeMond et al. | 340/701 |
| 5,195,103 A | | 3/1993 | Hinton et al. | |
| 5,529,630 A | * | 6/1996 | Imahashi et al. | 118/665 |
| 5,691,541 A | * | 11/1997 | Ceglio et al. | 250/492.1 |
| 5,923,466 A | * | 7/1999 | Krause et al. | 359/389 |
| 5,995,475 A | | 11/1999 | Gelbart | 369/112 |
| 6,037,967 A | * | 3/2000 | Allen et al. | 347/255 |
| 6,204,875 B1 | * | 3/2001 | De Loor et al. | 347/241 |
| 6,421,573 B1 | * | 7/2002 | Kafka et al. | 700/121 |
| 6,429,443 B1 | * | 8/2002 | Mankos et al. | 250/492.24 |
| 2002/0171047 A1 | * | 11/2002 | Chan et al. | 250/492.1 |

OTHER PUBLICATIONS

The Authoritative Dictionary of IEEE Standards Terms 2000, 7th edition, p. 607.*

* cited by examiner

Primary Examiner—Leo Picard
Assistant Examiner—Sean Schechtman
(74) Attorney, Agent, or Firm—Haynes & Boone, LLP

(57) ABSTRACT

A system and method for non-synchronously projecting light in an imaging system is provided. A pixel panel may be selectively controlled to direct light onto or away from a subject. A light source, such as a laser diode, projects light pulses at the pixel panel. The pulses are not synchronized with the pixel panel, so the light may strike the pixel panel at any time when the pixel panel is operable to direct light towards the subject. The pulses may be constant or variable in energy or duration, depending on the desired results.

19 Claims, 6 Drawing Sheets

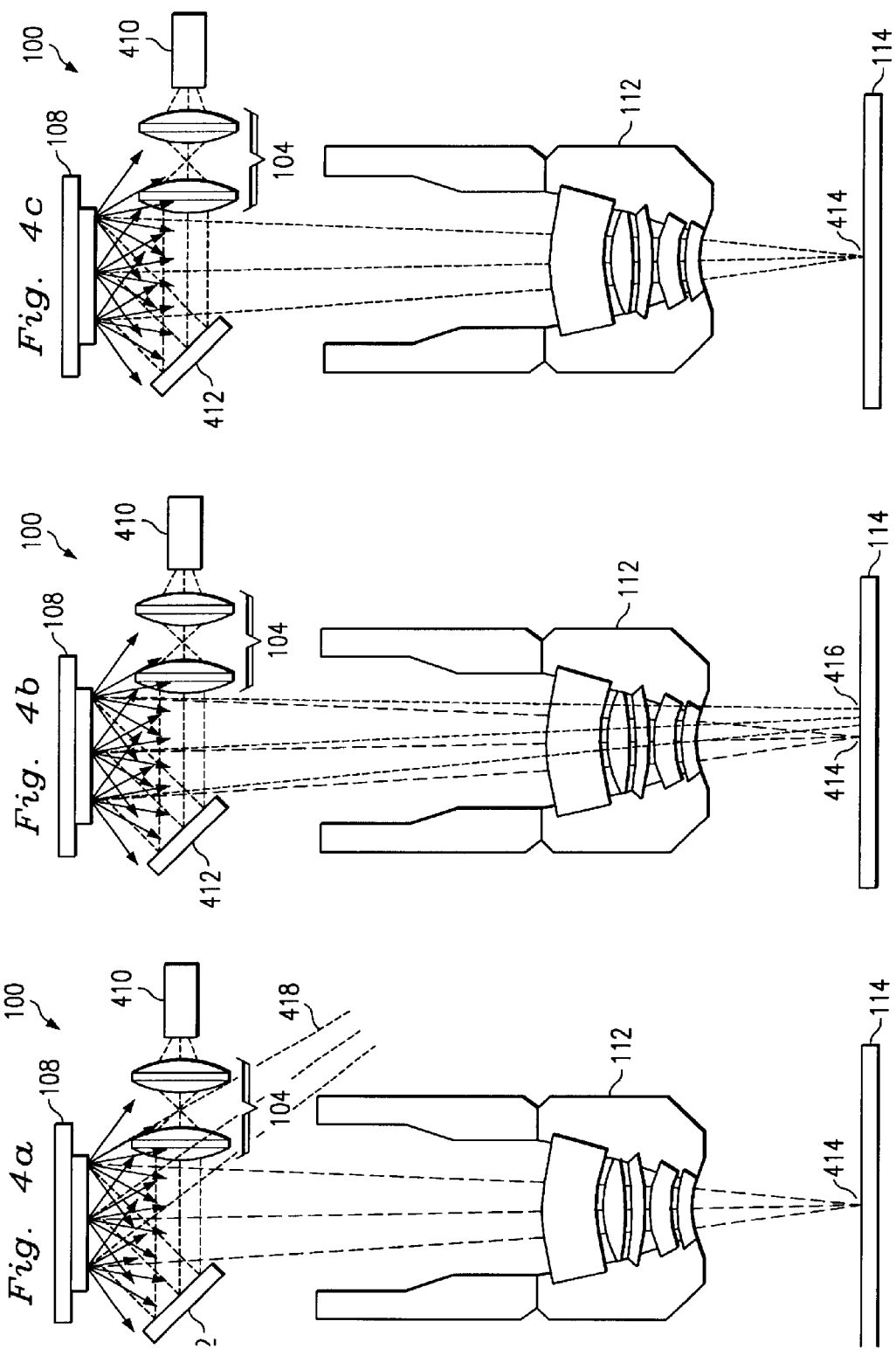

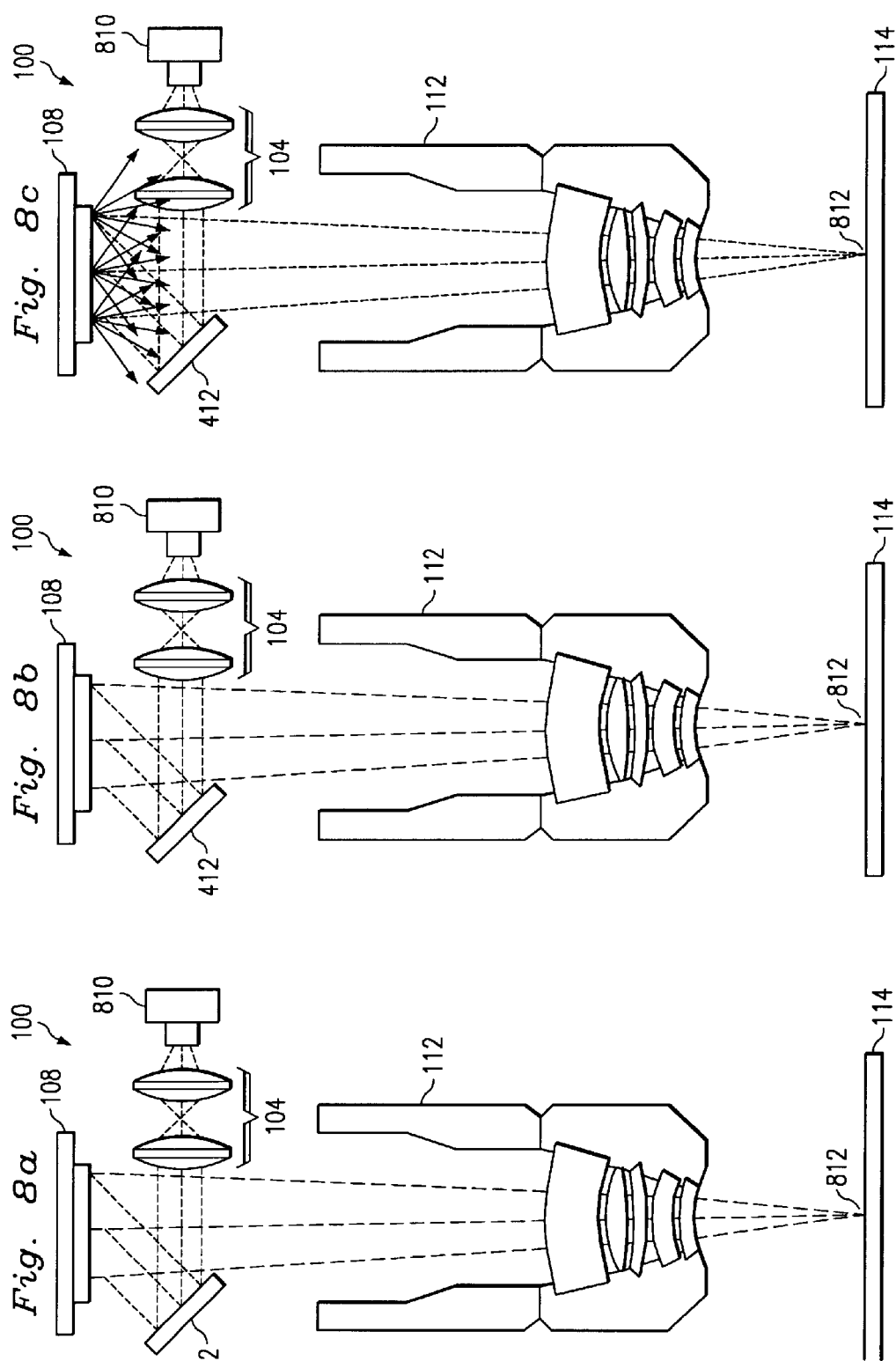

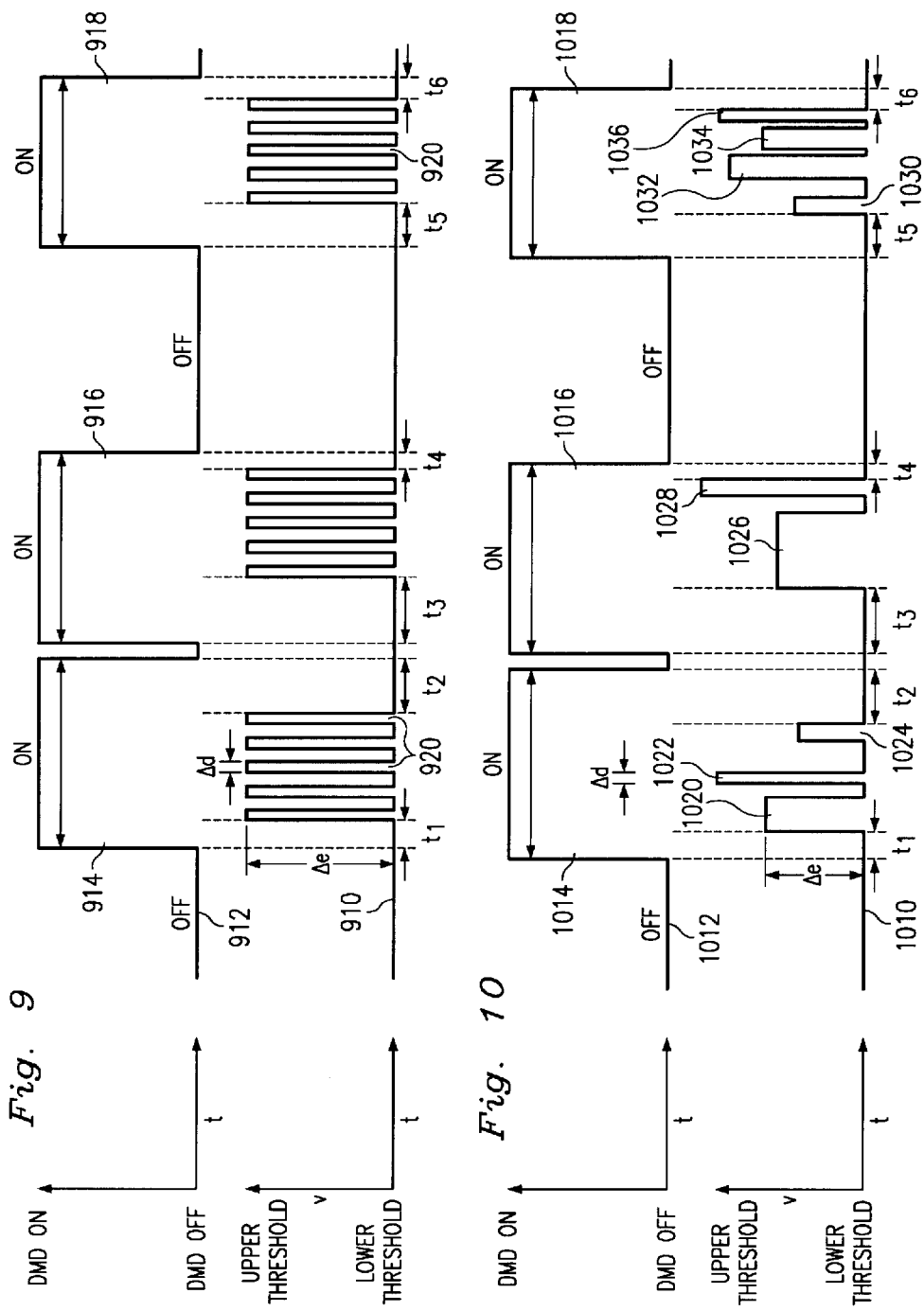

NON-SYNCHRONOUS CONTROL OF PULSED LIGHT

BACKGROUND

The present invention relates generally to imaging systems, and more particularly, to a system and method for controllably projecting and redirecting light.

Digital systems, such as those used in maskless photolithographic processing, typically utilize a light source to project a light onto a pixel panel. The pixel panel may then be controlled, for example, to either reflect the light onto a subject or away from the subject. Therefore, the projected light may remain relatively constant while the pixel panel controls whether the light is "on" (directed toward the subject) or "off" (directed away from the subject).

However, using the pixel panel to control the light may produce a number of undesirable results. For example, the fact that the light projected by the light source is relatively constant produces large amounts of heat, which may interfere with the proper operation of the system. The produced heat also requires equipment to aid in its dissipation, which increases the cost and complexity of the system. In addition, the operation of the pixel panel may create undesirable effects on the subject as it transitions between reflecting the light toward and away from the subject.

One way to overcome some of the above difficulties is to turn the light source on and off in synchronization with the pixel panel. However, it may be difficult to synchronize the light source with the pixel panel, due in part to the speed with which the pixel panel may transition from on to off and vice versa.

Therefore, certain improvements are needed in controllably projecting light toward a subject. For example, it is desirable to project the light onto the pixel panel non-synchronously. It is also desirable to lower the heat produced by the light source, to lower the power required by the light source, and to be more efficient.

SUMMARY

A technical advance is provided by a novel system and method for non-synchronously projecting light onto a subject in an imaging system. In one embodiment, the method includes providing a light source operable to project light in pulses and providing a pixel panel to selectively direct the projected light towards the subject. The method determines at least a first period and a second period during which the pixel panel directs the projected light towards the subject, where the first and second periods each have a start time. During the first period, the light is projected in at least one pulse towards the pixel panel at a first time relative to the start of the first period. During the second period, the light is projected in at least one pulse towards the pixel panel at a second time relative to the start of the second period, wherein the first and second times are not synchronized relative to the start of the first and second periods.

BRIEF DESCRIPTION OF DRAWINGS

FIG. 4 illustrates an exemplary imaging system utilizing a conventional light source.

FIG. 8 illustrates the imaging system of FIG. 4 utilizing a laser diode as a light source.

FIG. 9 is a graph illustrating the relationship between a DMD state and a laser diode signal, where the laser diode signal includes pulses of equal duration and energy.

FIG. 10 is a graph illustrating the relationship between a DMD state and a laser diode signal, where the laser diode signal includes pulses of variable duration and energy.

DETAILED DESCRIPTION

Figure 1:
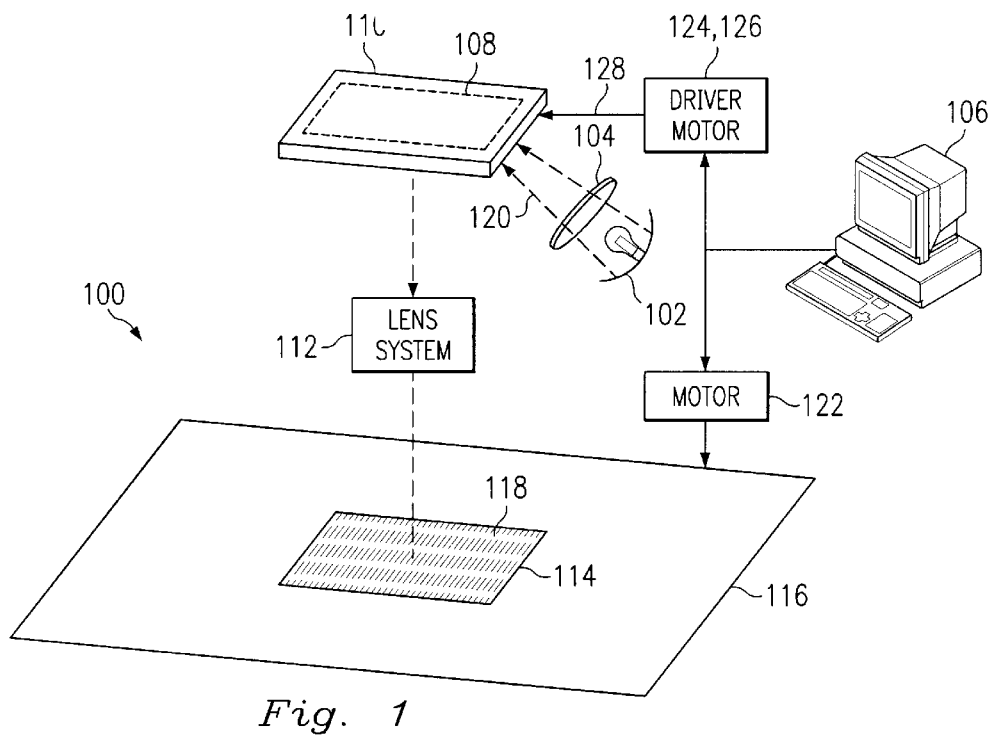
FIG. 1 is a diagrammatic view of an improved digital photolithography system for implementing various embodiments of the present invention.

The present disclosure relates to imaging systems, and more particularly, to a system and method for controllably projecting and redirecting light. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a maskless photolithography system 100 is one example of a system that can benefit from the present invention. In the present example, the maskless photolithography system 100 includes a light source 102, a first lens system 104, a computer aided pattern design system 106, a pixel panel 108, a panel alignment stage 110, a second lens system 112, a subject 114, and a subject stage 116. A resist layer or coating 118 may be disposed on the subject 114. The light source 102 may be an incoherent light source (e.g., a Mercury lamp) that provides a collimated beam of light 120 which is projected through the first lens system 104 and onto the pixel panel 108. Alternatively, the light 102 source may be an array comprising, for example, laser diodes or light emitting diodes (LEDs) that are individually controllable to project light.

The pixel panel 108, which may be a digital mirror device (DMD), is provided with digital data via suitable signal line(s) 128 from the computer aided pattern design system 106 to create a desired pixel pattern (the pixel-mask pattern). The pixel-mask pattern may be available and resident at the pixel panel 108 for a desired, specific duration. Light emanating from (or through) the pixel-mask pattern of the pixel panel 108 then passes through the second lens system 112 and onto the subject 114. In this manner, the pixel-mask pattern is projected onto the resist coating 118 of the subject 114.

The computer aided mask design system 106 can be used for the creation of the digital data for the pixel-mask pattern. The computer aided pattern design system 106 may include computer aided design (CAD) software similar to that which is currently used for the creation of mask data for use in the manufacture of a conventional printed mask. Any modifications and/or changes required in the pixel-mask pattern can be made using the computer aided pattern design system 106. Therefore, any given pixel-mask pattern can be changed, as needed, almost instantly with the use of an appropriate instruction from the computer aided pattern design system 106. The computer aided mask design system 106 can also be used for adjusting a scale of the image or for correcting image distortion.

In some embodiments, the computer aided mask design system 106 is connected to a first motor 122 for moving the stage 116, and a driver 124 for providing digital data to the pixel panel 108. In some embodiments, an additional motor 126 may be included for moving the pixel panel. The system 106 can thereby control the data provided to the pixel panel 108 in conjunction with the relative movement between the pixel panel 108 and the subject 114.

Efficient data transfer may be one aspect of the system 106. Data transfer techniques, such as those described in U.S. provisional patent application Serial No. 60/278,276, filed on Mar. 22, 2001, and also assigned to Ball Semiconductor, Inc., entitled "SYSTEM AND METHOD FOR LOSSLESS DATA TRANSMISSION" and hereby incorporated by reference as if reproduced in its entirety, may be utilized to increase the throughput of data while maintaining reliability. Some data, such as high resolution images, may present a challenge due in part to the amount of information needing to be transferred.

The pixel panel 108 described in relation to FIG. 1 has a limited resolution which depends on such factors as the distance between pixels, the size of the pixels, and so on. However, higher resolution may be desired. Such improved resolution may be achieved as described below and in greater detail in U.S. patent Ser. No. 09/923,233, filed on Aug. 3, 2001, and also assigned to Ball Semiconductor, Inc., entitled "REAL TIME DATA CONVERSION FOR A DIGITAL DISPLAY" and hereby incorporated by reference as if reproduced in its entirety.

Figure 2:
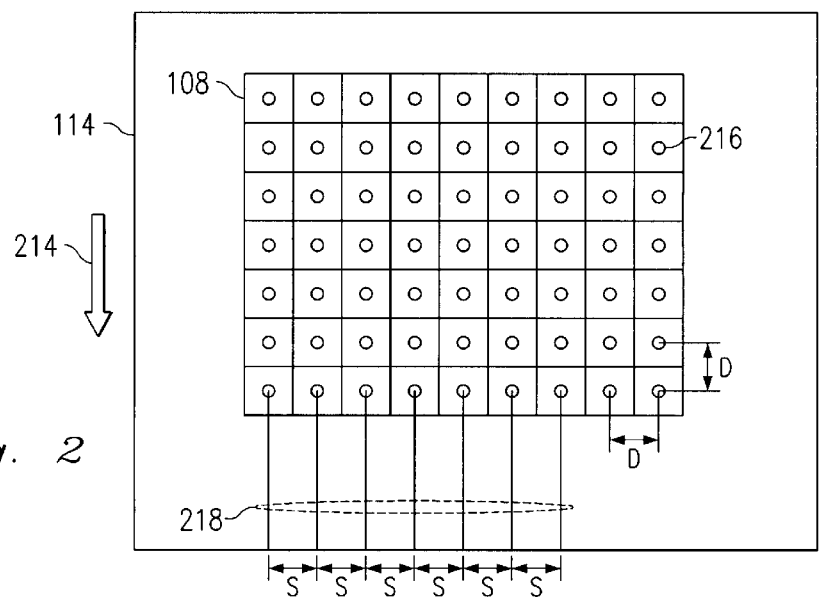
FIG. 2 illustrates an exemplary point array aligned with a subject.

Referring now to FIG. 2, the pixel panel 108 (comprising a DMD) of FIG. 1 is illustrated. The pixel panel 108, which is shown as a point array for purposes of clarification, projects an image (not shown) upon the subject 114, which may be a substrate. The substrate is moving in a direction indicated by an arrow 214. Alternatively, the point array 108 could be in motion while the substrate 114 is stationary, or both the substrate 114 and the point array 108 could be moving simultaneously. The point array 108 is aligned with both the substrate 114 and the direction of movement 214 as shown. A distance, denoted for purposes of illustration as "D", separates individual points 216 of the point array 108. In the present illustration, the point distribution that is projected onto the substrate 114 is uniform, which means that each point 216 is separated from each adjacent point 216 both vertically and horizontally by the distance D.

As the substrate 114 moves in the direction 214, a series of scan lines 218 indicate where the points 216 may be projected onto the substrate 114. The scan lines are separated by a distance "S". Because of the alignment of the point array 108 with the substrate 114 and the scanning direction 214, the distance S between the scan lines 218 equals the distance D between the points 216. In addition, both S and D remain relatively constant during the scanning process. Achieving a higher resolution using this alignment typically requires that the point array 108 embodying the DMD be constructed so that the points 216 are closer together. Therefore, the construction of the point array 108 and its alignment in relation to the substrate 114 limits the resolution which may be achieved.

Figure 3:
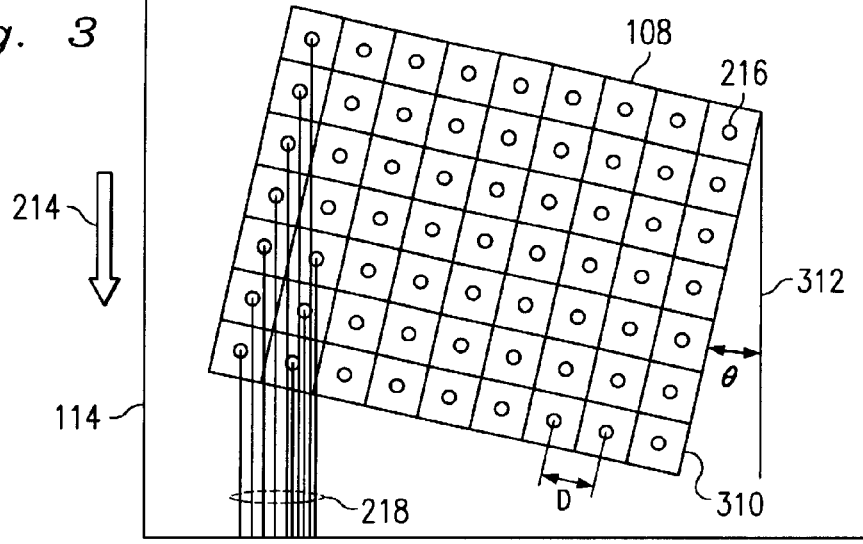
FIG. 3 illustrates the point array of FIG. 2 after being rotated relative to the subject.

Referring now to FIG. 3, a higher resolution may be achieved with the point array 108 of FIG. 2 by rotating the DMD embodying the point array 108 in relation to the substrate 114. The rotation is identified by an angle $\Theta$ between an axis 310 of the rotated point array 108 and a corresponding axis 312 of the substrate. As illustrated in FIG. 3, although the distance D between the points 216 remains constant, such a rotation may reduce the distance S between the scan lines 218, which effectively increases the resolution of the point array 108. The image data that is to be projected by the point array 108 must be manipulated so as to account for the rotation of the point array 108.

The magnitude of the angle $\Theta$ may be altered to vary the distance S between the scan lines 218. If the angle $\Theta$ is relatively small, the resolution increase may be minimal as the points 216 will remain in an alignment approximately equal to the alignment illustrated in FIG. 2. As the angle $\Theta$ increases, the alignment of the points 216 relative to the substrate 114 will increasingly resemble that illustrated in FIG. 3. If the angle $\Theta$ is increased to certain magnitudes, various points 216 will be aligned in a redundant manner and so fall onto the same scan line 218. Therefore, manipulation of the angle $\Theta$ permits manipulation of the distance S between the scan lines 218, which affects the resolution of the point array 108. It is noted that the distance S may not be the same between different pairs of scan lines as the angle $\Theta$ is altered.

Referring now generally to FIGS. 4a–c, in one embodiment, the operation of the photolithography system 100 of FIG. 1 is illustrated utilizing a conventional light source 410 to continuously project light during the operation of the system 100. In operation, the system 100 utilizes the light source 410 to direct light through the lens system 104 (shown as pair of lenses) and onto a reflective device 412 (not shown in FIG. 1) such as a mirror. The mirror 412 reflects the light onto the pixel panel 108, which may be a DMD. It is noted that the DMD 108 may be rotated to provide a desired resolution as described in reference to FIGS. 2 and 3. The light striking the DMD 108 is partially diffracted and scattered. The DMD 108 may selectively direct the light through a series of optical devices 112 and onto the subject 114 such as a substrate (in which case the DMD 108 will be referred to as "on") or may direct the light away from the substrate 114 (in which case the DMD 108 will be referred to as "off"). The light is to strike the substrate 114 at a desired location 414.

Referring now specifically to FIG. 4a, the conventional light source 102 is projecting light, but all the pixels in the DMD 108 are off and so the light is reflected away from the substrate 114 as indicated by the reference number 418. Referring now to FIG. 4b, the DMD 108 is in a transition state between off (FIG. 4a) and on (FIG. 4c). During this transition, the light which is projected from the light source 102 and reflected by the mirror 412 onto the DMD 108 is partially directed toward the substrate 114. However, because the transition period is not instantaneous, a portion of the light reflected during this time may not be properly directed by the DMD 108 toward the substrate 114. For example, the light may strike a location 416. This results in a blurring effect on the substrate 114, which is caused partially by the continuous projection of light onto the DMD 108 during its transition period. Referring now to FIG. 4c, the DMD 108 is on and the light is directed toward the location 414 on the substrate 114 as desired.

Figure 5:
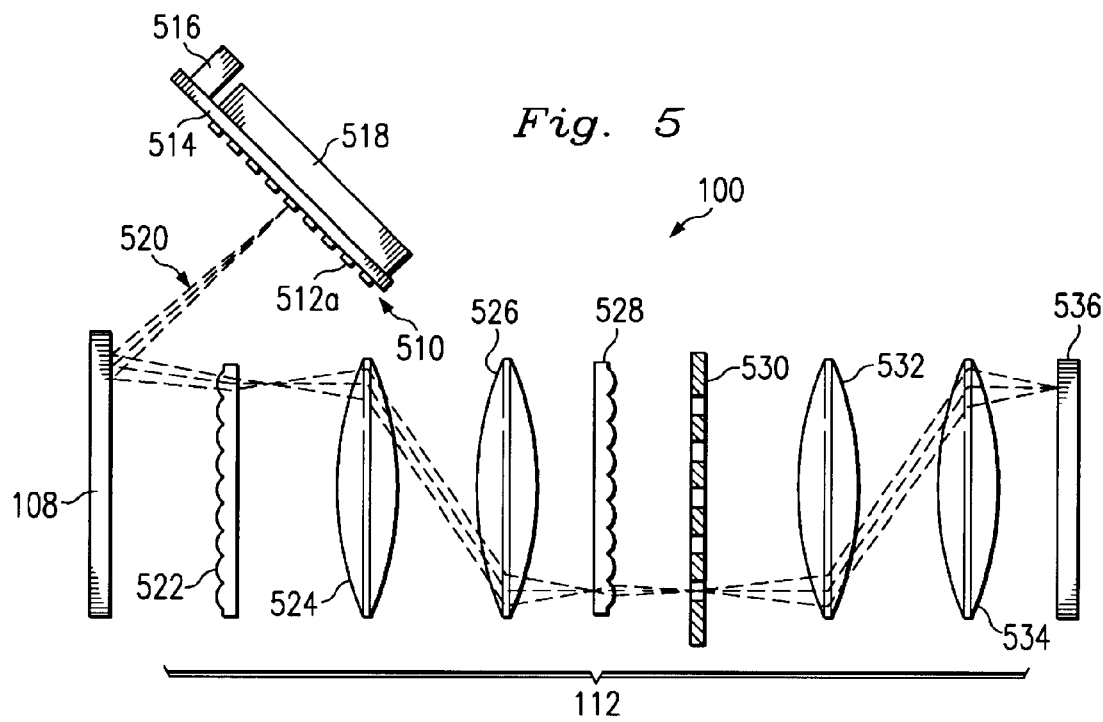
FIG. 5 illustrates a portion of an imaging system utilizing a laser diode array.

Referring now to FIG. 5, in another embodiment, a portion of the photolithography system 100 is illustrated using an LED array or a laser diode array 510 (both of which are hereinafter referred to as a laser diode array for purposes of clarity and described later in greater detail) as the light source 102 of FIG. 1 rather than the conventional Mercury lamp described previously. The laser diode array may be utilized to project light onto the pixel panel 108, which may be rotated as described in reference to FIGS. 2 and 3. As will be described in greater detail in relation to FIGS. 8a–c, higher resolution is possible using a laser diode because the light can be turned off during the mirror transition, reducing diffracted and scattered light. This aids in overcoming the blurring illustrated in the above discussion of FIGS. 4a–c. In addition, a smaller light source (as compared to a conventional Mercury arc lamp) improves the optical resolution by reducing the spot size at the focal point of the micro-lens array. Combining a laser diode with the rotation of a pixel panel as described in reference to FIGS. 2 and 3 may provide additional resolution benefits.

Although other relationships may be desirable, there may be a plurality of individual laser diodes for each pixel of the pixel panel 108. This enables the laser diode array 510 to provide higher exposure contrast because individual diodes may be selectively pulsed on and off to accommodate for the desired contrast level and field uniformity. In this way, if certain pixels of the pixel panel 108 are "dull," more light can be provided to these pixels, than to other less-dull pixels. This can also solve other problems that affect the contrast level.

Figure 6:
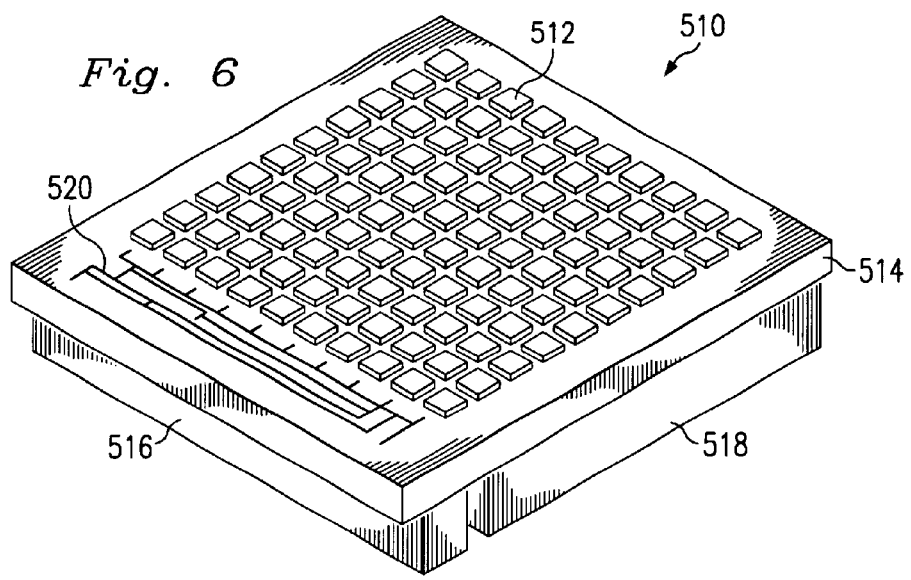
FIG. 6 illustrates the laser diode array of FIG. 5.

Referring now to FIG. 6, the laser diode array 510 of FIG. 5 is illustrated in greater detail. The laser diode array 510 comprises a plurality of laser diodes 512 embedded within or connectable to a substrate 514, which includes embedded circuitry 520. The circuitry 520, which may include embedded microelectronics and electrical connectors, is operable to provide parallel and/or serial control signals and/or address lines to the laser diode array 510. These control signals may enable the regulation of the wavelength and/or intensity of laser beams produced by the laser diode array 510. Connectable to the substrate 514 is a connector 516, which enables a computer aided design system (not shown) to control the laser diode array 510 through the circuitry 514. Proximate to the substrate 514 is a cooler 518, which may be a thermo-electric cooler such as a Peltier cooler. The cooler 518 permits uniform cooling to stabilize the performance of the laser diode array 510. The laser diode array 510 may also include memory (not shown), either embedded into the substrate 514 or made accessible to the array 510 using other common techniques.

Referring again to FIG. 5, the operation of a single laser diode 512a from the laser diode array 510 is described. The laser diode 512a projects a laser beam 520, which may be of varying wavelengths and intensity. The wavelength and intensity of the beam 520 may be altered to achieve a desired result. For example, the intensity and/or wavelength of the beam 520 may be altered by regulating the current supplied to the laser diode 512a. Such regulation may be exercised on an individual diode basis or multiple laser diodes 512 may be controlled at once.

The shape of the beam 520 projected by the laser diode 512 and reflected off the pixel panel 108 may be distorted relative to some desired beam shape, and so may require correction. Therefore, the beam 520 may be passed through the lens system 112 of FIG. 1, which may include a plurality of optical devices, including an aspherical or cylindrical lens array 522 to reshape the beam into the desired shape. For example, the laser diode 512a may produce a beam 520 having an oval shape, instead of a desired circular shape. Therefore, the lens array 522 may be utilized to reshape the oval beam into a circular beam. Once the laser beam 520 is reshaped, it passes through a pair of lenses 524, 526 and then a micro-lens array 528. The micro-lens array 528, which is a multi-focus device, may produce a one or two dimensional point array. The beam 520 then passes through a grating 530, which may take on various forms, be placed in alternate locations, and in some embodiments, may be replaced with another device or not used at all. The beam 520 then passes through a second set of lenses 532, 534 before striking the surface of a subject 536.

Figure 7:
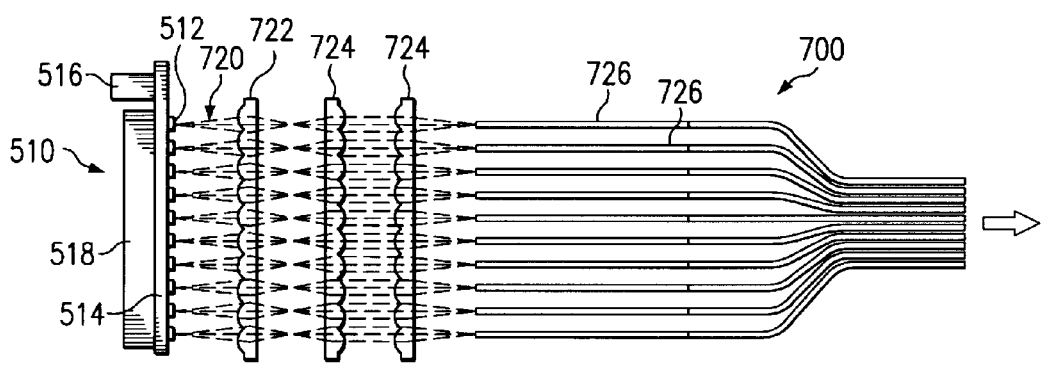
FIG. 7 illustrates utilizing the laser diode array of FIG. 6 as a high power light source.

Referring now to FIG. 7, in yet another embodiment, the laser diode array 510 of FIGS. 5 and 6 may be utilized as a high power light source 700 by combining the output of multiple laser diodes 512. The laser diodes 512 of the array 510, of which only ten are illustrated for the sake of clarity, project laser beams 720. The beams 720 first pass through a lens array 722 for any desired reshaping of the beams 720 as described above in reference to FIG. 5. The beams 720 then pass through a micro-lens array 724. The micro-lens array 724 provides enhanced coupling between the laser diodes 712 and multiple multimode optic fibers 726. The fibers 726 may be bundled into one or more outputs, which may transfer the light to optics for beam reshaping, decorrelation, and/or the application of other techniques. The output may be used for photolithography, as a laser pump for other lasing media, or in a variety of other applications where such a high power light source may be desired.

A variety of embodiments illustrating various approaches for implementing laser diodes in a photolithography system are described in additional detail in U.S. provisional patent application Serial No. 60/274,371, filed on Mar. 8, 2001, and also assigned to Ball Semiconductor, Inc., entitled "HIGH POWER INCOHERENT LIGHT SOURCE WITH LASER ARRAY" and U.S. patent application Ser. No. 09/820,830, filed on Mar. 28, 2001, and also assigned to Ball Semiconductor, Inc., entitled "INTEGRATED LASER DIODE ARRAY AND APPLICATIONS", both of which are hereby incorporated by reference as if reproduced in their entirety.

Referring now generally to FIGS. 8a–c, in one embodiment, the photolithography system 100 of FIG. 4a–c is illustrated utilizing a laser diode 810 rather than the conventional light source 410. The laser diode 810 may be operated in the same manner as the conventional light source 410 (i.e., in a relatively continuous manner using a continuous wave mode), or may be operated in a pulse mode which allows the laser diode 810 to be turned on and off as desired. The laser diode 810 is able to pulse at an extremely high frequency (e.g., in the gigahertz range).

Utilizing the laser diode 810 in pulse mode may provide a higher average power delivery than continuous wave mode. In addition, the pulsing may increase the lifetime of a pixel panel due in part to reduced turn-on time. The pulsing may also reduce the amount of heat produced by the laser diode 810.

In operation, the photolithography system 100 utilizes the laser diode 810 to direct light through the lens system 104 (shown as pair of lenses) and onto the mirror 412. The mirror 412 reflects the light onto the pixel panel 108, which for purposes of illustration is a DMD. The light striking the DMD 108 is partially diffracted and scattered, although the scattering and diffraction may be less than that occurring in the system 100 in FIGS. 4a–c due in part to the different light sources (e.g., laser versus conventional). The DMD 108 may selectively direct the light through the series of optical devices 112 and onto the substrate 114 (in which case the DMD 108 will be referred to as "on") or may direct the light away from the substrate 114 (in which case the DMD 108 will be referred to as "off"). The light is to strike the substrate 114 at a desired location 812.

Referring specifically to FIG. 8a, the laser diode 810 is off and so is not projecting light. All the mirrors of the DMD 108 is also off and so light striking the DMD 108 would be reflected away from the substrate 114. Referring now to FIG. 8b, the DMD 108 is in a transition state between off (FIG. 8a) and on (FIG. 8c). During this transition, the laser diode 810 is off and so no light is projected toward the DMD 108. As the DMD 108 is not receiving light from the laser diode 810, the DMD 108 is not directing light toward the substrate 114. Because no light is being directed toward the substrate 114, there is no blurring effect as was described previously with respect to the conventional light source 410 of FIGS. 4a–c. Referring now to FIG. 8c, the transition period of the DMD 108 is complete and the DMD 108 is on. The laser diode 810 may be turned on to project light toward the DMD 108, which may direct the light toward the substrate 114 without blurring. Therefore, the undesirable blurring effect present in the system 100 of FIGS. 4a–c may be avoided using the laser diode 810 because the laser diode 810 does not project light during the DMD 108 transition period.

Referring now to FIG. 9, in one embodiment, a laser diode output signal 910 is shown in non-synchronized operation with a pixel panel state 912. The laser diode signal 910, which may reflect the operation of a laser diode such as the laser diode 810 of FIGS. 8a–c, may be "high" (indicating that the associated laser diode (not shown) is on, i.e., projecting light) or "low" (indicating that the associated laser diode is off, i.e., not projecting light). The pixel panel state 912, which may reflect the operation of a pixel panel such as the DMD 108 of FIGS. 8a–c, may be "on" and "off". As described previously, "on" indicates that the DMD is reflecting at least a portion of the light projected onto it toward a subject. "Off" indicates that the DMD is reflecting the light away from the subject. In the present example, "windows" 914–918 indicate the period of time that the DMD remains on. It is noted that the windows 914–918 could denote the time the DMD remains off, or different windows may be established indicating the state of the DMD, such as an "on window" and/or an "off window." For purposes of simplification, the transition state is illustrated as being instantaneous. This simplification does not alter the described operation of the laser diode/DMD combination because the laser diode may be off during the DMD transition state.

Synchronization may be difficult and add complexity to the implementation of systems such as the photolithography system 100 of FIG. 8. For example, because a window may only exist for a relatively short amount of time (i.e., a few hundred microseconds), it may be difficult to precisely synchronize the laser pulse with the window. Accordingly, the lack of synchronization in the present example enables the laser diode signal 910 to pulse at any time during the period when the pixel panel state 912 is on.

In operation, the laser diode signal 910 is generated in pulse mode rather than continuous wave mode. In pulse mode, the associated laser diode may be turned on and off multiple times in a single window to produce pulses 920. Each pulse 920 includes an energy level $\Delta e$ and a duration $\Delta d$. The energy level $\Delta e$ refers to the amount of energy output by the laser diode during the particular pulse 920, while the duration $\Delta d$ indicates the length of time during which the pulse 920 occurs.

In the present example of FIG. 9, the pulse energy and the pulse duration are constant in the windows 914–918. The duration $\Delta d$ of each pulse 920 is of approximately the same length. Likewise, each pulse 920 contains approximately the same amount of energy $\Delta e$. Therefore, any given window will have approximately the same pulse energy and pulse duration. It is noted that $\Delta d$ and $\Delta e$ for each pulse are approximately equal, but may vary within a range which has been predetermined as acceptable.

For binary operation, the total number of pulses 920 in each window 914–918 is fixed (i.e., each window includes the same number of pulses as the other windows). However, the timing of the pulses 920 in a particular window 914–920 may be non-synchronous. The timing indicates when the pulses 920 occur in the windows 914–918. For example, the five pulses 920 occur in the window 914 earlier than in the window 916 (i.e., $t_1 < t_3$ and $t_2 > t_4$). For grayscale operation, the total number of pulses 920 may be individually controlled in each window 914–918. Therefore, while the duration $\Delta d$ and energy $\Delta e$ will be constant for each pulse 920, each window may have a different number of pulses 920. For example, the window 914 may have three pulses of duration $\Delta d$ and energy $\Delta e$, while the window 916 may have four pulses of the same duration $\Delta d$ and energy $\Delta e$. As with the binary operation, the pulses 920 are non-synchronous and so the timing of the pulses 920 may vary by window.

It is noted that in both binary and grayscale operation, the pulses 920 may occur at the same time in the windows 914–918, so that:

$$t_1 = t_3 = t_5.$$

Alternatively, none of the pulses 920 may occur at the same time so that:

$$t_1 \neq t_3 \neq t_5.$$

In addition, certain windows 914–918 may be equivalent while others may be unique. Therefore, the non-synchronous approach of the present invention enables utilization of both synchronous and non-synchronous operation as desired.

Referring now to FIG. 10, in another embodiment, a laser diode output signal 1010 is shown in conjunction with a pixel panel state 1012 in a plurality of windows 1016–1018 such as those in FIG. 9. As before, the pixel panel associated with the pixel panel state 1012 is a DMD for purposes of illustration. However, in the present example, the pulse duration $\Delta d$ and the pulse energy $\Delta e$ of a plurality of pulses 1020–1036 are variable. The duration of each pulse 1020–1036, indicated by $\Delta d$, may vary within a single window 1014–1018. Likewise, the energy $\Delta e$ of each pulse 1020–1036 may vary within a single window 1014–1016. Therefore, any pulse 1020–1036 in a given window may have a unique pulse energy $\Delta e$ and pulse duration $\Delta d$. It is noted that there may be desirable minimum and/or maximum limits for the duration $\Delta d$ and energy $\Delta e$ of each pulse according to a particular application.

For binary operation, the total amount of energy produced in each window 1014–1018 is fixed (i.e., each window 1014–1018 includes the same amount of energy as the other windows). Therefore, although the energy $\Delta e$ of each pulse 1020–1036 may vary, the total energy of the pulses 1020–1036 associated with a particular window 1014–1018 should be identical to the other windows. For example, the pulses 1020–1024 are associated with the window 1014, and each pulse 1020–1024 may include a unique amount of energy $\Delta e$. Likewise, the pulses 1026, 1028 are associated with the window 1016, and each pulse 1026, 1028 may include a unique amount of energy $\Delta e$. Because the windows should have the same total amount of energy for binary operation, the combined energy Δe of the pulses 1020–1024 should equal the combined energy Δe of the pulses 1026, 1028.

It is noted that the total energy of a particular window 1014–1018 may be produced using pulses of varying duration Δd as well as pulse energy Δe. For example, a level of total energy may be produced in the window 1014 using a series of low energy pulses having long durations. However, the same level of total energy may be produced in the window 1016 using a series of relatively high energy pulses having relatively shorter durations. In this manner, the total energy produced in a window may be produced using a variety of different combinations of pulse energy and durations.

Due to the non-synchronous operation of the laser diode producing the signal 1010 with the DMD state, the timing of the pulses 1020–1036 in the associated window 1014–1018 may vary. For example, the pulses 1020–1024 illustrated in the window 1014 are not only different in duration and pulse energy than those in the window 1018, but the pulse 1020 occurs earlier in the window 1014 than the pulse 1026 in the window 1016 (i.e., $t_1 < t_3$). Likewise, the pulse 1024 ends earlier in the window 1014 than the pulse 1028 in the window 1016 (i.e., $t_2 > t_4$).

For grayscale operation, the total amount of energy produced by the respective pulses in each window 1014–1018 may vary. For example, the total amount of energy delivered by the pulses 1020–1024 in the window 1014 may be double the total amount of energy delivered by the pulses 1026, 1028 in the window 1016. As in binary operation, the timing of those pulses may vary non-synchronously by window.

It is noted that in both the binary and grayscale operations of FIG. 10, one or more of the pulses 1020–1036 may occur at the same time in the windows 1014–1018 or none of the pulses 1020–1036 may occur at the same time. In addition, certain windows 1014–1018 may be equivalent while others may be unique. Therefore, the non-synchronous approach of the present invention enables utilization of both synchronous and non-synchronous operations as desired, and allows the particular pulse characteristics for a single window to be tailored to produce a desired output for that window.

While the invention has been particularly shown and described with reference to the preferred embodiment thereof, it will be understood by those skilled in the art that various changes in form and detail may be made therein without departing from the spirit and scope of the invention. For example, it is within the scope of the present invention to not project light during a period when the DMD is on, and so create a "dark" frame. Therefore, the claims should be interpreted in a broad manner, consistent with the present invention.

What is claimed is:

1. A method for projecting light onto a subject in an imaging system, the method comprising:
   providing a light source operable to project light in pulses;
   providing a pixel panel to selectively direct the projected light towards the subject;
   determining at least a first period and a second period during which the pixel panel directs the projected light towards the subject, the first and second periods each having a start time;
   during the first period, projecting the light in at least one pulse towards the pixel panel at a first begin time relative to the start of the first period and halting the projection of light at a first end time relative to the start of the first period;
   during the second period, projecting the light in at least one pulse towards the pixel panel at a second begin time relative to the start of the second period and halting the projection of light at a second end time relative to the start of the second period; and
   determining an interval between the first end time and the second begin time wherein the interval duration is variable and wherein the first and second begin times are not synchronized relative to the start times of the first and second periods.

2. The method of claim 1 further including determining an energy amount to be produced in each pulse and determining a duration for each pulse.

3. The method of claim 1 further including a stop time for each of the first and second periods, wherein the stop time of the first period occurs before the start time of the second period.

4. The method of claim 3 wherein the at least one pulse in the first period is of the same duration and energy as the at least one pulse in the second period.

5. The method of claim 4 wherein there are an equal number of pulses in the first and second periods.

6. The method of claim 3 wherein the at least one pulse in the first period differs in duration from the at least one pulse in the second period.

7. The method of claim 3 wherein there are a different number of pulses in the first and second periods.

8. The method of claim 1 further including a third period, wherein no light is projected towards the pixel panel during the third period.

9. An imaging system for projecting light onto a subject during photolithographic processing, the apparatus comprising:
   a light source operable to project light in pulses;
   a pixel panel to selectively direct the projected light towards the subject;
   a processor connectable to the light source;
   a memory accessible to the processor; and
   software stored in the memory, the software comprising a plurality of instructions for:
      determining at least a first period and a second period during which the pixel panel directs the projected light towards the subject, the first and second periods each having a start time;
      during the first period, projecting the light in at least one pulse towards the pixel panel at a first begin time relative to the start of the first period and halting the projection of light at a first end time relative to the start of the first period;
      during the second period, projecting the light in at least one pulse towards the pixel panel at a second begin time relative to the start of the second period and halting the projection of light at a second end time relative to the start of the second period; and
      determining an interval between the first end time and the second begin time wherein the interval duration is variable and wherein the first and second begin times are not synchronized relative to the start times of the first and second periods.

10. The system of claim 9 wherein the light source is a laser diode operating in pulse mode.

11. The system of claim 9 wherein the software further includes instructions for regulating the energy produced during each pulse.

12. The system of claim 9 wherein the software further includes instructions for regulating the duration of each pulse.

13. A method for non-synchronously projecting light pulses in a plurality of sequential periods in a photolithography system, the method comprising:

defining a length of time for each of the plurality of periods, each of the periods having a period start time;

determining an energy and a duration for each of the light pulses in each of the periods;

projecting the light pulses non-synchronously during the plurality of periods, the projection beginning at a pulse start time after the period start time of each period and the projection ending at a pulse stop time, so that wherein the pulse start time for each period is not synchronized with the pulse start times of the other periods; and creating an interval time between the pulse stop time and the pulse start time for the next period in the plurality wherein the interval time varies between each of the plurality of periods.

14. The method of claim 13 further including setting the energy and duration of each pulse as constant.

15. The method of claim 14, wherein each period includes a constant number of pulses.

16. The method of claim 13 wherein the sum of pulse energy in each period is equal.

17. The method of claim 1 wherein there are a plurality of pulses in each of the first and second periods.

18. The method of claim 1 further including determining a transition state during which the pixel panel selectively changes between directing projected light toward the subject and directing projected light away from the subject, wherein the transition state occurs at least once after the first period and before the second period.

19. The method of claim 18 the light source projects no light pulses during the transition state.

* * * * *